(12) United States Patent
Ciesla et al.

(10) Patent No.: US 10,910,509 B2
(45) Date of Patent: Feb. 2, 2021

(54) METHOD FOR IMPROVING WAFER PERFORMANCE FOR PHOTOVOLTAIC DEVICES

(71) Applicant: NEWSOUTH INNOVATIONS PTY LIMITED, Sydney (AU)

(72) Inventors: Alison Ciesla, Cronulla (AU); Brett Jason Hallam, Bexley (AU); Catherine Emily Chan, Kensington (AU); Chee Mun Chong, Bellevue Hill (AU); Daniel Chen, Bankstown (AU); Darren Bagnall, Coogee (AU); David Neil Payne, Redfern (AU); Ly Mai, East Hills (AU); Malcolm David Abbott, Naremburn (AU); Moonyong Kim, Kensington (AU); Ran Chen, Botany (AU); Stuart Ross Wenham, Cronulla (AU); Tsun Hang Fung, Kensington (AU); Zhengrong Shi, Kirribilli (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 16/461,864

(22) PCT Filed: Nov. 22, 2017

(86) PCT No.: PCT/AU2017/051289
§ 371 (c)(1),
(2) Date: May 17, 2019

(87) PCT Pub. No.: WO2018/094461
PCT Pub. Date: May 31, 2018

(65) Prior Publication Data
US 2019/0371960 A1 Dec. 5, 2019

(30) Foreign Application Priority Data

Nov. 22, 2016 (AU) ............................... 2016904784
Nov. 22, 2016 (AU) ............................... 2016904785
(Continued)

(51) Int. Cl.
*H01L 31/18* (2006.01)
*H01L 31/0288* (2006.01)

(52) U.S. Cl.
CPC ...... *H01L 31/1868* (2013.01); *H01L 31/0288* (2013.01); *H01L 31/1804* (2013.01); *H01L 31/1864* (2013.01)

(58) Field of Classification Search
CPC .................................................. H01L 31/1868
See application file for complete search history.

(56) References Cited

U.S. PATENT DOCUMENTS

2016/0225930 A1 8/2016 Hallam et al.

FOREIGN PATENT DOCUMENTS

WO 2016/102990 A1 6/2016
WO WO 2016102990 * 6/2016 ............. H01L 31/18

OTHER PUBLICATIONS

Lee et al. "Review of advanced hydrogen passivation for high efficient crystalline silicon solar cells" Materials Science in Semiconductor Processing, vol. 79, Jun. 1, 2018, pp. 66-73 (Year: 2018).*

(Continued)

*Primary Examiner* — John A Bodnar
(74) *Attorney, Agent, or Firm* — Ajay A. Jagtiani; Miles & Stockbridge P.C.

(57) ABSTRACT

The present disclosure is directed to a method for processing a silicon wafer that allows improving performance by exploiting the properties of crystallographic imperfections.

(Continued)

The method comprises the steps of: forming a silicon layer with crystallographic imperfections in the proximity of a surface of the silicon; exposing at least a portion of the device to hydrogen atoms in a manner such that hydrogen atoms migrate towards the region with crystallographic imperfections and into the silicon along the crystallographic imperfections; and controlling the charge state of hydrogen atoms located at the crystallographic imperfections to be positive when the imperfections are in a p-type region of the wafer; and negative when the imperfections are at an n-type region of the wafer by thermally treating the silicon while exposing the silicon to an illumination intensity of less than 10 mW/cm$^2$.

11 Claims, 2 Drawing Sheets

(30) Foreign Application Priority Data

| | | |
|---|---|---|
| Nov. 22, 2016 | (AU) | 2016904786 |
| Nov. 22, 2016 | (AU) | 2016904787 |
| Nov. 22, 2016 | (AU) | 2016904788 |
| Nov. 22, 2016 | (AU) | 2016904789 |
| Dec. 23, 2016 | (AU) | 2016905364 |
| Jun. 23, 2017 | (AU) | 2017902441 |

(56) References Cited

OTHER PUBLICATIONS

Hamer et al. "Manipulation of Hydrogen Charge States for Passivation of P-Type Wafers in Photovoltaics" IEEE Journal of Photovoltaics, vol. 4, No. 5, Sep. 2014 (Year: 2014).*
International Search Report received in PCT Application No. PCT/AU2017/051289 dated Jan. 2, 2018.
Dubois et al., "Effect of intentional bulk contamination with iron on multicrystalline silicon solar cell properties", Journal of Applied Physics, 102, pp. 083525-1 (2007).
Duerinckx et al., "Defect passivation of industrial multicrystalline solar cells based on PECVD silicon nitrade", Solar Energy Materials & Solar Cells, 72, pp. 231-246 (2002).
Herring et al., "Energy levels of isolated interstitial hydrogen in silicon" Physical Review B, vol. 64, pp. 12509 1-12509 27 (2001).
Pritchard et al., "Hydrogen molecules in boron-doped crystalline silicon", Semicond. Sci. Technol., 14, pp. 77-80 (1999.

* cited by examiner

METHOD FOR IMPROVING WAFER PERFORMANCE FOR PHOTOVOLTAIC DEVICES

FIELD OF THE INVENTION

The present invention generally relates to methods for manufacturing photovoltaic devices. In particular, the invention relates to manufacturing methods for improving the efficiency of photovoltaic devices.

BACKGROUND OF THE INVENTION

Silicon is the main semiconductor material used to fabricate today's commercial photovoltaic (PV) cells. The majority of commercial PV cells are fabricated from a monocrystalline or multi-crystalline silicon wafer. A p-n junction is formed in the silicon wafer by, for example, diffusing n-type atoms in a p-type silicon wafer.

Electrically active defects throughout a PV cell affect the lifetime of charge carriers causing reduced performance. These defects may be related to the quality of the wafer, or can be created during fabrication.

A significant trade-off exists between wafer cost and wafer quality. Currently, production is dominated by lower quality, lower cost multi-crystalline silicon wafers which achieve lower efficiencies than the single crystal silicon counterparts. The lower cost of multi-crystalline silicon wafers, however, allows for the large share of the photovoltaic market. Such wafers have a range of different types of crystallographic imperfections that degrade performance such as dislocations, grain boundaries and a range of other defects. Wafer fabrication techniques that can reduce the density or severity of such crystallographic imperfections will add to the cost of the wafers, leading to the present range of commercially available wafers whereby the price is higher for wafers with a lower density and/or severity of crystallographic defects. Hydrogen passivation has been used for several decades to reduce the impact of crystallographic defects since it is a low cost, easy to implement process. It is well documented in the literature that it is only the active or atomic hydrogen that is able to bond to the defects to bring about their passivation. However, it is also well documented in the literature that much of the hydrogen within the silicon wafer is in molecular form that is in equilibrium with the atomic hydrogen (Herring, C, Johnson, N M & Van de Walle, C G 2001, Energy levels of isolation interstitial hydrogen in silicon, Physical Review B, vol. 64.) (Pritchard, R E, Tucker, J H, Newman, R C & Lightowlers, E C 1999, Hydrogen molecules in boron-doped cristalline silicon Semicond. Sci. Technol. vol. 14.). Nevertheless, with recent advanced hydrogenation techniques, changing the charge state of the atomic hydrogen and allowing it to shift to other locations therefore will necessitate more of the molecular hydrogen dissociating into atomic hydrogen to restore equilibrium therefore making such reserves of molecular hydrogen available to contribute to the potential passivation of defects once dissociated.

SUMMARY OF THE INVENTION

In accordance with an aspect, the present invention provides a method for processing a silicon wafer comprising the steps of:
(a) forming a silicon layer with crystallographic imperfections in the proximity of a surface of the silicon, the crystallographic imperfections extending at least 10% through the thickness of the silicon layer;
(b) exposing at least a portion of the device to hydrogen atoms in a manner such that hydrogen atoms migrate towards the region with crystallographic imperfections and into the silicon along the crystallographic imperfections;
(c) controlling the charge state of hydrogen atoms located at the crystallographic imperfections to be positive when the imperfections are in a p-type region of the wafer; and negative when the imperfections are at an n-type region of the wafer by thermally treating the silicon while exposing the silicon to an illumination intensity of less than 10 $mW/cm^2$.

In some embodiments steps (b) and (c) are combined into a single step.

In embodiments, step (c) comprises the step of controlling the charge state of hydrogen atoms located at the crystallographic imperfections by thermally treating the silicon while exposing the silicon to an illumination intensity of less than 1 $mW/cm^2$.

In embodiments, step (c) comprises the step of controlling the charge state of hydrogen atoms located at the crystallographic imperfections by thermally treating the silicon while exposing the silicon to an illumination intensity of less than 0.1 $mW/cm^2$.

In some embodiments, the method further comprises the step of controlling the temperature of the wafer. For example, during process (c) the temperature may be maintained in a range comprised between 100° C. and 500° C.

In embodiments, the method further comprises the step of controlling the carrier injection level in the silicon.

In embodiments, the method further comprises the step of controlling the background intentional doping concentration in the proximity of the region with the crystallographic imperfections.

In embodiments, the method further comprises one or more of the following steps:
(i) increasing the carrier injection level through illumination;
(ii) increasing the carrier injection level through the application of an external electric field to forward bias the photovoltaic cell junction;
(iii) illuminating the wafer with sub-bandgap photons that are able to convert $H^-$ into $H^0$;
(iv) thermally diffusing sufficient atomic hydrogen at a temperature within the range of 100° C. to 500° C. into the region with the imperfections so that the localised atomic hydrogen concentration in one or more regions exceeds the intentional background doping concentration to cause the auto-generation of $H^0$;
(v) maintaining (i), (ii), (iii) or (iv) or any combination of these at a temperature within the range of 100° C. to 500° C. for a minimum of 2 seconds, preferably 8 seconds and more preferably in excess of 1 minute to facilitate hydrogen passivation of to improve the quality of the whole silicon layer including the crystalline silicon regions.

Advantages of embodiments, allow preventing high concentrations of hydrogen at the wafer surface that could reduce the diffusive flow of hydrogen into the silicon wafer. This provides a mechanism for diffusing a larger amounts of hydrogen, particularly atomic hydrogen, into the silicon which, in turn can passivate defects within the material comprising the silicon wafer, leading to a higher wafer quality.

In some embodiments, the imperfections are formed in a manner to penetrate deep into the silicon wafer or, in some instances, right through the wafer to allow the diffusion of larger amounts of hydrogen deep within the silicon wafer.

Importantly, by keeping the hydrogen atoms in a charged state, the likelihood that hydrogen migrates away from imperfections is minimised. The likelihood for hydrogen to move away from the imperfections is higher when hydrogen is in the neutral charge state as its diffusivity is sufficiently high in all directions.

In current silicon passivation techniques, steps are taken to maintain hydrogen in the neutral state to enhance its diffusivity. The Applicants have discovered that, on the contrary, maintaining the hydrogen in its charged states allows exploiting the deliberately created imperfections to drive the hydrogen through the silicon material in the wafer.

In some embodiments, the method further comprises the step of controlling the carrier injection level in the silicon. This may be achieved by keeping the wafer in the dark or controlling the intensity of radiation with an energy sufficient to create electron-hole pairs in the silicon material.

Furthermore, the injection levels can be controlled by maintaining the temperature in a given range. In particular, the method may comprise the step of maintaining the temperature of the wafer in a range comprised between 100° C. and 500° C. This allows the atomic hydrogen to diffuse sufficiently quickly along the defect and avoids an excessive increase of thermal generation of the hydrogen neutral charge-state fraction.

Furthermore, the method may include the step of maintaining the background intentional doping concentration in the proximity of the region with the crystallographic imperfections, along which the atomic hydrogen is being diffused, above the desired interstitial atomic hydrogen concentration (typically $5^{14}$ atoms/cm$^3$). This minimises the auto-generation of the neutral charge-state of the hydrogen.

BRIEF DESCRIPTION OF THE DRAWINGS

Features and advantages of the present invention will become apparent from the following description of embodiments thereof, by way of example only, with reference to the accompanying drawings in which.

DETAILED DESCRIPTION OF EMBODIMENTS

Figure 1:
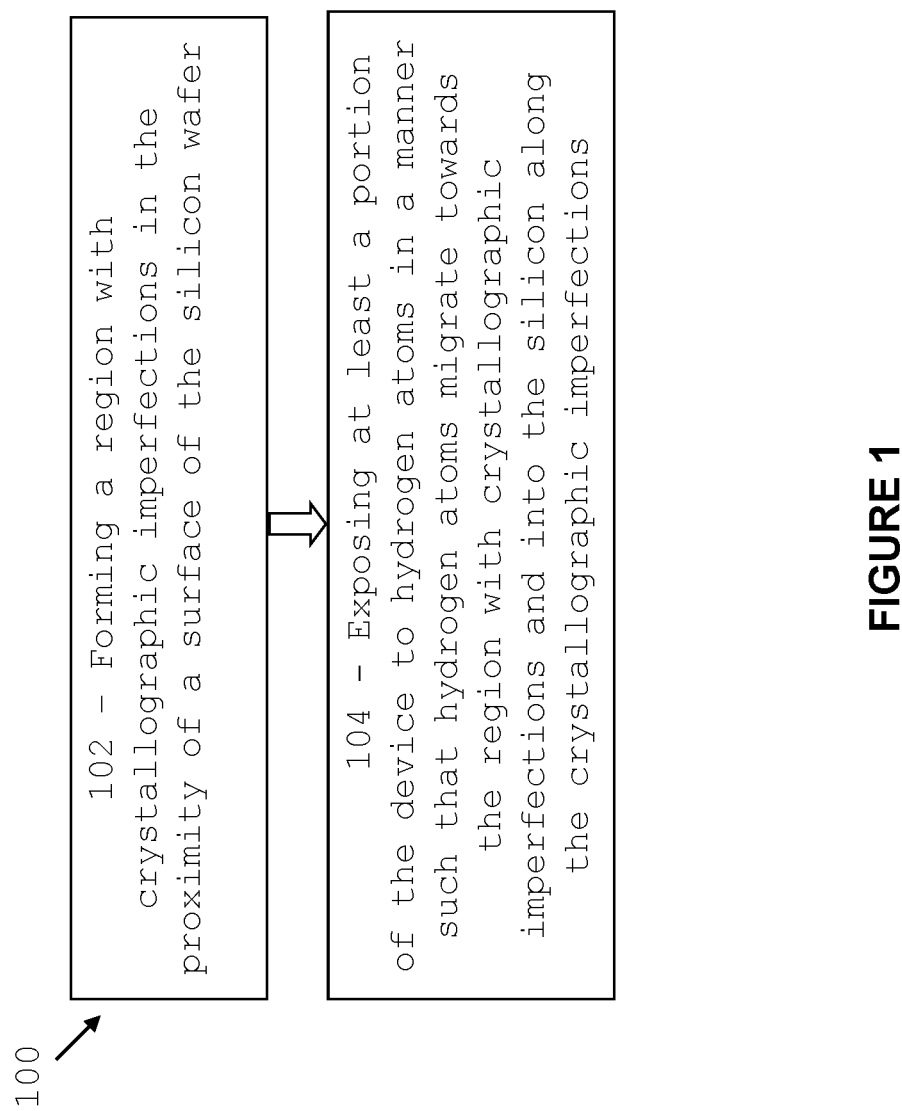
FIGS. 1 and 2 is a flow diagram showing steps required to process a silicon wafer in accordance with embodiments.

Embodiments of the present invention relate to the field of photovoltaics and processing of wafers, such as silicon wafers for manufacturing photovoltaic devices. In particular, embodiments relate to the incorporation of manufacturing processes to improve quality of silicon wafers and photovoltaic devices.

This disclosure is relevant to all crystalline and multicrystalline silicon solar cells that capitalise on the hydrogen passivation of defects and/or recombination by diffusing or implanting or driving hydrogen into the defected regions of the silicon material and coupling some of this hydrogen preferentially to deep into the silicon material from one or more external hydrogen sources.

A silicon solar cell in the presence of one or more hydrogen sources that are able to thermally diffuse hydrogen into one or more of the surfaces of the silicon wafer that has crystallographic defects in the vicinity of the wafer surface. These defects preferably extend from the surface to at least 10% through the silicon wafer whereby the intentional net background doping in the vicinity of the defects is at least 1e15 dopants/cm$^3$ when the defects lie within p-type silicon and 3e14 dopants/cm$^3$ when in n-type silicon. If the hydrogen source is a dielectric layer such as PECVD deposited silicon nitride, a preheating step for the dielectric coated wafer (or partly fabricated solar cell) may be required for the thermal release of atoms of hydrogen within the dielectric layer.

The wafer is subsequently thermally heated to a temperature determined by the nature of the hydrogen source to allow atomic hydrogen to preferentially diffuse from the source layer or gas or plasma into the crystallographic defected regions at the wafer surface. The wafer is subsequently maintained in the temperature range of 100° C. to 500° C. while being kept essentially in the dark (exposed to illumination of less than 10 mW/cm$^2$ and preferably less than 1 mW/cm$^2$ and ideally less than 0.1 mW/cm$^2$) to ensure that almost all the atomic hydrogen within the p-type regions is H$^+$ and all the atomic hydrogen within the n-type regions is H$^-$. This control of the hydrogen charge state allows the hydrogen to preferentially diffuse along the crystallographic defects due to such hydrogen atoms having much higher diffusivities along the defected regions compared into the silicon crystals. Although molecular hydrogen is unlikely to move significantly compared to atomic hydrogen, at any given location for a given temperature and injection level, it is well known that molecular hydrogen will form from or dissociate into atomic hydrogen as needed to maintain equilibrium concentrations (Herring, C, Johnson, N M & Van de Walle, C G 2001, Energy levels of isolation interstitial hydrogen in silicon, Physical Review B, vol. 64.) (Pritchard, R E, Tucker, J H, Newman, R C & Lightowlers, E C 1999, Hydrogen molecules in boron-doped crystalline silicon Semicond. Sci. Technol. vol. 14.).

This means that as large volumes of hydrogen enter the defected silicon from an external hydrogen source, a certain portion will form molecular hydrogen. This molecular hydrogen then acts as a store of hydrogen that will dissociate into atomic hydrogen to maintain equilibrium as atomic hydrogen diffuses away from that location such as along the crystallographic defects, which is then also able to diffuse as atomic hydrogen.

Following the accumulation of sufficient atomic hydrogen within and along the crystallographic defects, while maintaining the temperature within the range of 100° C. to 500° C., one or more processes are subsequently used to increase the Hydrogen neutral charge state (H$^0$) fraction in the vicinity of the crystallographic defects to enhance its reactivity to facilitate passivation of the crystallographic defects within the crystallographic regions and to greatly increase its diffusivity so hydrogen can escape the crystallographically defected regions into the non or less crystallographically defected regions to also carry out passivation of any recombination. The approach for increasing the hydrogen neutral charge state (H$^0$) fraction in the vicinity of the crystallographic defects could include one or more of the following processes:

(a) Raising the injection level within the silicon through illumination of the wafer;

(b) Raising the injection level within the silicon through the application of an external electric field to forward bias the solar cell diode;

(c) Illuminating the wafer with sub-bandgap photons that are able to convert H$^-$ into H$^0$ but while being minimally absorbed by the crystalline silicon regions;

(d) Continuing the previous process in the dark (or less than 1 mW/cm$^2$ light intensity) at a temperature within the range of 100° C. to 500° C. to thermally diffuse additional atomic hydrogen into the crystallographic defected regions so that the localised atomic hydrogen concentration in one or more regions exceeds the intentional background doping concentration to cause the auto-generation of $H^0$.

This invention can be broken down into three successive stages, with the first stage being the deliberate provision of crystallographic defects such as grain-boundaries and dislocations at the surface of the silicon wafer to couple or transfer atomic hydrogen at an increased rate and volume from an adjacent hydrogen source, into the silicon wafer. Suitable hydrogen sources include surface dielectric layers that contain hydrogen such as may be deposited by PECVD, sputtering or ALD or else a hydrogen containing plasma or gas. Some hydrogen sources may need an initial activation step to make the atomic hydrogen available to subsequently diffuse into the silicon surface such as the preheating of a hydrogen containing PECVD silicon nitride layer to thermally release hydrogen atoms from their bonds within the silicon nitride layer. The importance of the crystallographic imperfections is that hydrogen atoms in an appropriate charge state will have much higher diffusivity along the crystallographic defect rather than in non-defected crystalline silicon, therefore allowing the atomic hydrogen within such defected regions to diffuse more rapidly away from the surface and deeper into the silicon rather than accumulating at the silicon surface in a manner that tends to block or retard the further diffusion of hydrogen from the hydrogen source into the silicon. The net result is that the presence of such defects can allow much larger quantities of atomic hydrogen to rapidly penetrate into the silicon wafer and all else being equal, the higher the density of such defects, the greater the total diffusion of hydrogen into the silicon wafer.

Virtually any crystallographic defect that penetrates from the wafer surface into the silicon wafer and has a suitable juxtaposed hydrogen source, can accelerate the diffusion of atomic hydrogen into the silicon wafer when heated. Suitable defects can be formed in many ways such as by stressing the silicon to as to cause dislocations, either at the wafer surface or even deeper within the wafer in a way that facilitates its propagation to the wafer surface. In many cases, suitable crystallographic imperfections can be formed during the ingot formation process such as with grain-boundaries and dislocations that can potentially propagate through entire ingots and therefore through each individual wafer after sawing. The ingot growth process can therefore also affect or control the density of such defects. Another example is the casting of single crystal silicon that can build up so much stress within the silicon during solidification that dislocations can form and then potentially propagate right through to the top of the ingot where the solidification process is completed. Densities of crystallographic defects can also be significantly impacted by the solidification rates for the silicon and the presence of certain impurities during the ingot growth. Mechanical stressing of the silicon wafer can also be used to form suitable crystallographic defects that penetrate into the silicon from the surface. Chemical treatments can also be used such as through etching of the surface to form regions susceptible to crystallographic defect formation such as porous silicon formed from immersion in an HF-based solution when simultaneously illuminated. Another example of a suitable chemical treatment of the surface is to oxidise the silicon surface at high temperature which leads to the oxide layer placing the silicon surface under tension when cooled due to the silicon wafer having a higher thermal expansion coefficient than the oxide layer. Silicon is known to be very weak under tension, therefore easily dislocated if the oxide layer is more than about 300 nm. Such dislocations can easily penetrate from the surface to deep within the silicon, often propagating along the <1,1,1> planes. This ability to create crystallographic defects can be further enhanced by roughening the silicon surface such as by chemical texturing or plasma etching or mechanically scribing the silicon surface prior to oxidising the surface. Such roughening of the surface acts to concentrate the stress in localised regions when such an oxide layer acts to place the silicon surface under tension.

One of the most effective ways of introducing suitable crystallographic defects that penetrate right through silicon wafers is through the formation of grain boundaries during the ingot growth or wafer formation. Grain boundaries can potentially be formed with any desired density and located wherever desired by seeding the crystal growth or cooling the molten silicon at an appropriate rate to nucleate and grow crystals of the desired size.

The second stage of this invention can optionally be broken down into two successive steps. The first step involves exposing at least a portion of the device to hydrogen atoms in a manner such that hydrogen atoms migrate towards the region with crystallographic imperfections and into the silicon along the crystallographic imperfections. The second step involves controlling the charge state of the hydrogen atoms, so as to preferentially diffuse much of the hydrogen along the crystallographic defects to later passivate such defects and to allow more hydrogen to diffuse into the wafer surfaces and to penetrate to deeper within the silicon wafer. This is achieved by capitalising on the ability of crystallographic defects to provide enhanced diffusivities for most elements in the direction along the crystallographic defect. The extent of enhancement in the diffusivity is often greater for elements that have relatively poor diffusivity in non-defected silicon, making the $H^+$ and $H^-$ charge states for hydrogen atoms preferable to $H^0$ for enhanced diffusion along the crystallographic defects. To ensure almost all the hydrogen is in the positive charge state $H^+$ when the defect is in p-type silicon and in the negative charge state $H^-$ when the defect is passing through n-type silicon, it is necessary for the silicon to be sufficiently highly doped, kept below 500° C. and in low level injection such as by keeping it in the dark (<1 mW/cm$^2$ illumination). To be sufficiently highly doped for defects or part of defects in the p-type regions, the intentional net doping needs to be above 1e14 atoms/cm$^3$ and preferably above 1e15 atoms/cm$^3$ while for the defects or part of defects within n-type regions, the intentional net doping needs to be above 5e13 atoms/cm$^3$ and preferably above 3e14 atoms/cm$^3$.

It is therefore necessary when enhancing the diffusion of hydrogen along the crystallographic defects of the wafer, to do so at a temperature within the range 100° C. to 500° C. and preferably within the range 225° C. to 425° C. and ideally within the range 300° C. to 400° C. while keeping the wafer in the dark (at a light intensity <1 mW/cm$^2$ and ideally <0.1 mW/cm$^2$) and for a duration that allows sufficient atomic hydrogen to accumulate within the crystallographically defected regions and to the desired depth from the wafer surface. Depending on the nature of the hydrogen source, it is sometimes preferable for this thermal process to be conducted in two parts whereby one temperature is used for optimal diffusion of the hydrogen from the hydrogen source (such as the hydrogen containing dielectric layer) and then a different temperature that is optimal for enhancing the diffusion along the crystallographic defects relative to diffusion into the non-defected regions but while achieving adequate throughput to be manufacturable. In addition to increased diffusivity, there are 2 other benefits to the increased temperature; firstly, as atomic hydrogen diffuses away, molecular hydrogen at that location dissociates into atomic hydrogen to restore equilibrium; and, secondly, it is well documented in the literature that the higher temperatures shift the equilibrium in favour of higher concentrations of atomic hydrogen relative to molecular (Voronkov, V V & Falster, R 2017, Formation, dissociation, and diffusion of various hydrogen dimers in silicon, Phys. Status Solidi B, vol. 254.)(Herring, C, Johnson, N M & Van de Walle, C G 2001, Energy levels of isolation interstitial hydrogen in silicon, Physical Review B, vol. 64.) (Pritchard, R E, Tucker, J H, Newman, R C & Lightowlers, E C 1999, Hydrogen molecules in boron-doped crystalline silicon Semicond. Sci. Technol. vol. 14.) in both cases the atomic hydrogen resulting from dissociated molecules acts as an additional source of higher diffusivity active hydrogen.

Once sufficient hydrogen has diffused along the various crystallographic defects and accumulated in sufficient quantities in the various locations, a subsequent third stage can be used to increase the concentration of the neutral charge state of hydrogen $H^0$ for the purpose of allowing the hydrogen atoms to bond to the various defects and thereby passivate them. For example, in p-type silicon where almost all the hydrogen within the crystallographic defect is $H^+$, the provision of an electron through its transformation into $H^0$ then increases its reactivity with the electron making it easier for the hydrogen to chemically bond to and passivate defects previously causing recombination. Several approaches can be used for increasing the concentration of the neutral charge state of hydrogen $H^0$. One example is to illuminate the wafer with an intensity of at least 20 mW/cm$^2$ and preferably above 200 mW/cm$^2$ and ideally above 2 W/cm$^2$ while heated to a temperature within the range of 100° C. to 500° C. to facilitate the passivation of most of the sources of recombination within the crystallographic defects and the subsequent diffusion of some of the atomic hydrogen away from the crystallographically defected regions to facilitate the hydrogen passivation of other sources of recombination throughout the wafer such as caused by boron-oxygen defects or various contaminants.

A second example is to raise the injection level within the silicon through the application of an external electric field to forward bias the solar cell diode, preferably also at elevated temperatures of at least 100° C. to accelerate the process. A third example if the wafers are n-type or have n-type regions is to illuminate the wafer with sub-bandgap photons of intensity of at least 10 mW/cm$^2$ and preferably above 100 mW/cm$^2$ and ideally above 1 W/cm$^2$ to convert at least some of the H to $H^0$ but while being minimally absorbed by crystalline silicon while the wafer is simultaneously heated to a temperature within the range of 100° C. to 500° C. to facilitate the passivation of most of the sources of recombination within the crystallographic defects and the subsequent diffusion of some of the atomic hydrogen away from the crystallographically defected regions to facilitate the hydrogen passivation of other sources of recombination throughout the wafer such as caused by oxygen related defects or various other contaminants. A fourth example is to heat the wafer to a temperature within the range 100° C. to 500° C. and preferably within the range 300° C. to 450° C. and ideally within the range 400° C. to 450° C. while keeping the wafer in the dark (at a light intensity <1 mW/cm$^2$ and ideally <0.1 mW/cm$^2$) to allow sufficient additional atomic hydrogen to thermally diffuse from the hydrogen source at the surface into and along the crystallographically defected regions so that the localised atomic hydrogen concentration in one or more regions exceeds the intentional background doping concentration to cause the auto-generation of $H^0$. The concept of the auto-generation of $H^0$ is described elsewhere and for example in p-type silicon, involves the $H^+$ hydrogen atoms within the crystallographically defected regions acting as donor dopants to counter-dope or passivate the intentional background p-type dopants so that in at least some localised regions of the crystallographic defects, sufficient atomic hydrogen accumulates so that the concentration of atomic hydrogen becomes comparable to or even exceeds the concentration of intentional background p-type dopants, therefore effectively removing or nullifying or passivating p-type dopants. The corresponding shift in Fermi Energy level at equilibrium causes a significant change in the fractional charge state distributions for the hydrogen atoms, significantly increasing the concentrations of both $H^0$ and $H^-$, therefore facilitating the passivation of the crystallographic defects that was not possible in the p-type material with $H^+$. With $H^0$ also having many orders of magnitude higher diffusivity than $H^-$ or $H^-$, the $H^0$ is able to relatively easily escape from the regions of high crystallographic defects by diffusing into the regions with lower hydrogen concentrations and less crystallographic defects such as away from (or out of) grain boundaries or dislocation clusters where the hydrogen has accumulated into other regions where hydrogen passivation can then take place. The movement of $H^0$ out of such regions leads to the depletion of $H^0$, leading to the further auto-generation of $H^0$ and its diffusion into surrounding regions of lower concentration until the atomic hydrogen concentration drops to below that of the intentional background dopants. At this point, there is no longer sufficient hydrogen atoms acting as donors to compensate most of the p-type dopants and the Fermi energy level shifts in favour of increased $H^+$ fraction and reduced $H^0$ fraction.

The equivalent can occur for crystallographic defects that have sections (or are totally) located within n-type silicon, except that in this case the hydrogen atoms transform into $H^-$ and therefore act as acceptor atoms, counter-doping the n-type dopants. Again, with sufficient hydrogen atoms, virtually all of the n-type dopants can be effectively neutralised or passivated, shifting the Fermi Energy level so as to again increase the $H^0$ fraction. This is again referred to as the auto-generation of $H^0$, again making it easy to then passivate the crystallographic defects with the $H^0$ and then allowing the surplus $H^0$ to diffuse into other regions of lower hydrogen concentration to passivate any types of defects or contaminants potentially causing recombination.

Embodiments of the present invention, provide a silicon solar cell in the presence of one or more hydrogen sources that are able to thermally diffuse hydrogen into one or more of the surfaces of the silicon wafer, that has crystallographic defects in the vicinity of the wafer surface that extend from the surface to at least partway (10%) through the silicon wafer whereby the intentional net background doping in the vicinity of the defects is at least 1e15 dopants/cm$^3$ in p-type regions and 3e14 dopants/cm$^3$ in n-type regions is heated to a temperature in the range of 100° C. to 500° C. to allow atomic hydrogen to preferentially diffuse into and along the crystallographic defected regions at the wafer surface and along the crystallographic defects while being kept essentially in the dark (exposed to illumination of less than 1 mW/cm$^2$) to ensure that almost all the atomic hydrogen within the p-type regions is $H^+$ and all the atomic hydrogen within the n-type regions is $H^-$.

In some embodiments, following the accumulation of sufficient atomic hydrogen within and along the crystallographic defects, while maintaining the temperature within the range of 100° C. to 500° C., one or more processes are used to increase the Hydrogen neutral charge state (H⁰) fraction in the vicinity of the crystallographic defects including one or more of the following processes:

(a) Raising the injection level through illumination (b) Raising the injection level through the application of an external electric field to forward bias the solar cell diode (c) Illuminating the wafer with sub-bandgap photons that are able to convert H⁻ into H⁰

(d) Continuing to thermally diffuse sufficient atomic hydrogen at a temperature within the range of 100° C. to 500° C. into the crystallographic defected regions so that the localised atomic hydrogen concentration in one or more regions exceeds the intentional background doping concentration to cause the auto-generation of H⁰.

(e) maintaining (a), (b), (c) or (d) or any combination of these at a temperature within the range of 100° C. to 500° C. for a minimum of 2 seconds and preferably 8 seconds and more preferably in excess of 1 minute to facilitate hydrogen passivation of the crystalline silicon regions to improve their quality.

Figure 2:
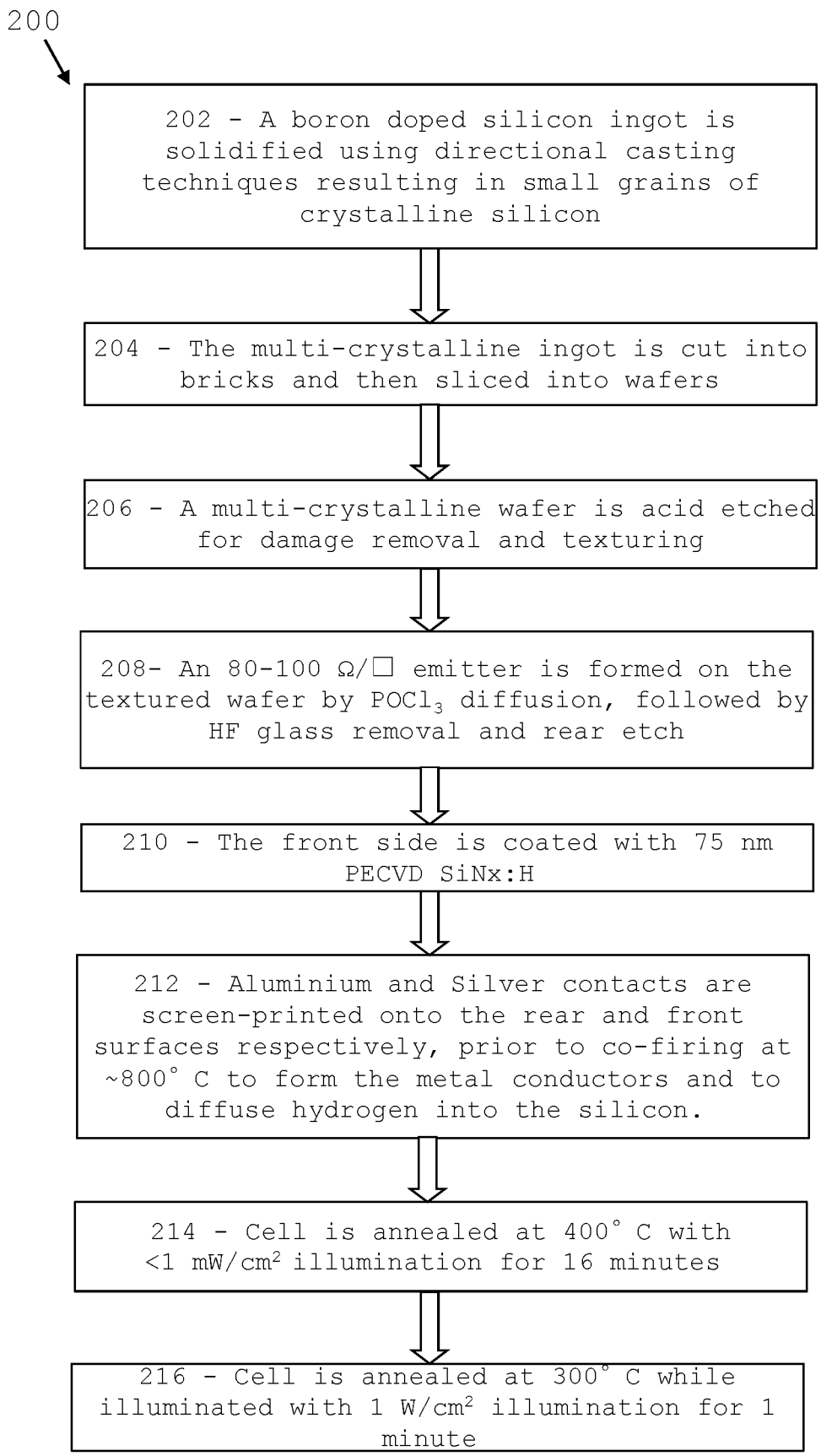

Referring now to FIG. 2, there is shown a flow chart 200 a process in accordance with an embodiment. In this example, a boron doped silicon ingot is solidified using directional casting techniques resulting in small grains of crystalline silicon and therefore large amounts of crystallographic imperfections in the form of grain boundaries. The ingot is cut into bricks and then sliced into wafers. A p-type multi-crystalline wafer is acid etched for damage removal and texturing. The wafer is then phosphorus diffused to form an 80-100Ω/☐ n-type emitter, followed by HF immersion to remove the phosphosilicate glass and rear-etch to remove the diffusion off the rear. The front side is coated with 75 nm PECVD SiNx:H as a dielectric for surface passivation, anti-reflection coating and hydrogen source. Aluminium and Silver contacts are screen-printed onto the rear and front surfaces respectively. The cell is fired at ~800° C. for co-form the metal contacts, while also releasing hydrogen from its bonds in the silicon nitride. The cell is then annealed at 400° C. in the dark (with <1 mW/cm² illumination) for 16 minutes. The increased temperature increases the diffusivity of the hydrogen within the dielectric to enable it to diffuse into the silicon, preferentially into the crystallographic imperfections in the silicon. The low illumination maintains the hydrogen largely in the majority charge state, H⁻ in the n-type emitter, and H⁺ in the p-type bulk, to minimise diffusion within the crystalline regions thereby allowing the hydrogen to diffuse along the crystallographic imperfections or grain boundaries. Maintaining the temperature and low illumination for 16 minutes, enables the hydrogen to move deeper into the silicon along the grain boundaries, and as it moves deeper, allows more hydrogen to diffuse in from the dielectric and more molecular hydrogen to dissociate into atomic hydrogen, allowing large concentrations of hydrogen to accumulate within and along the grain boundaries extending right through the wafer. Once the hydrogen is trapped throughout the grain boundaries, the cell is annealed at 300° C. while illuminated with 1 W/cm² illumination to convert some of the hydrogen trapped in the grain boundaries to H⁰ to enhance diffusivity within the crystalline silicon grains as well as increase reactivity to enable the hydrogen to bond with defects within the grain boundaries or the crystalline silicon grains thereby enhancing passivation of the whole wafer.

In another example, this invention can be applied to a laser-doped, selective emitter, plated PERC cell. A boron doped silicon ingot is solidified using monocrystalline seed-assisted casting techniques creating a 'cast-mono' silicon ingot. Such a technique can able the formation of dislocation networks from the bottom to the top of the ingot thereby enabling crystallographic defects that can penetrate through the full thickness of wafers once the ingot is cut into bricks and then sliced into wafers. A 2 Ω-cm p-type cast-mono wafer undergoes saw damage removal followed by alkaline texturing. The wafer is then phosphorus diffused to form an 100-120Ω/☐ n-type emitter, followed by HF immersion to remove the phosphosilicate glass and rear-etch to remove the diffusion off the rear. Both the front and rear are passivated with 10 nm thermal oxide prior to ~75 nm PECVD SiNx:H, providing hydrogen sources on each side of the wafer. The front surface is laser doped with a phosphorus source to simultaneously create contact openings in the dielectric and heavily dope the openings creating a selective emitter. The rear side is laser patterned to create contact openings the dielectric. Aluminium is screen printed across the rear and fired above the Eutectic 577° C. to form the rear metal contact, while also releasing hydrogen from its bonds in the silicon nitride layers. The cell is then light-induced plated with a Nickel base layer. The cell is annealed at 400° C. in the dark (with <1 mW/cm² illumination) for 10 minutes to sinter the nickel and form a nickel silicide. The temperature also increases the diffusivity of the hydrogen within the dielectric to enable it to diffuse into the silicon from each side, preferentially into the dislocations and other crystallographic imperfections in the silicon. The low illumination maintains the hydrogen largely in the majority charge state, H⁻ in the n-type emitter, and H⁺ in the p-type bulk, to minimise diffusion within the crystalline regions thereby allowing the hydrogen to diffuse along the crystallographic imperfections or grain boundaries. Maintaining the temperature and low illumination for 10 minutes, enables the hydrogen to move deeper into the silicon along the grain boundaries, and as it moves deeper, allows more hydrogen to diffuse in from the dielectric and more molecular hydrogen to dissociate into atomic hydrogen, allowing large concentrations of hydrogen to accumulate within and along the grain boundaries extending right through the wafer. Toward the end of the process, the illumination is increased to 100 mW/cm² to convert some of the hydrogen trapped in the grain boundaries to H⁰ to enhance diffusivity within the crystalline silicon grains as well as increase reactivity to enable the hydrogen to bond with defects within the grain boundaries or the crystalline silicon grains thereby enhancing passivation of the whole wafer. The cell is then completed by light-induced plating with bulk copper metal followed by silver capping.

It will also be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The term "comprising" (and its grammatical variations) as used herein are used in the inclusive sense of "having" or "including" and not in the sense of "consisting only of".

The invention claimed is:

1. A method for processing a silicon photovoltaic cell, the method comprising the steps of:

(a) providing a crystalline silicon substrate that includes crystallographic imperfections in the proximity of a surface of the silicon substrate, the crystallographic imperfections extending at least 10% through a thickness of the silicon substrate;

(b) exposing at least a portion of the silicon substrate to hydrogen atoms in a manner such that hydrogen atoms migrate towards a region with the crystallographic imperfections and into the silicon substrate along the crystallographic imperfections; and (c) controlling a charge state of hydrogen atoms located at the crystallographic imperfections to be positive when the imperfections are in a p-type region of the silicon substrate; and negative when the imperfections are at an n-type region of the silicon substrate by thermally treating the silicon substrate while exposing the silicon substrate to an illumination intensity of less than 10 mW/cm$^2$.

2. The method of claim 1 wherein steps (b) and (c) are combined into a single step.

3. The method of claim 1 wherein step (c) comprises the step of controlling the charge state of hydrogen atoms located at the crystallographic imperfections by thermally treating the silicon substrate while exposing the silicon substrate to an illumination intensity of less than 1 mW/cm$^2$.

4. The method of claim 1 wherein step (c) comprises the step of controlling the charge state of hydrogen atoms located at the crystallographic imperfections by thermally treating the silicon substrate while exposing the silicon substrate to an illumination intensity of less than 0.1 mW/cm$^2$.

5. The method of claim 1, wherein the method further comprises the step of controlling a temperature of the silicon substrate.

6. The method of claim 1 wherein the method during process (c) further comprises the step of maintaining a temperature of an environment of the silicon substrate within a range comprised between 100° C. and 500° C.

7. The method of claim 1, wherein the method further comprises the step of controlling a carrier injection level in the silicon substrate.

8. The method of claim 1, wherein the method further comprises the step of controlling an intentional background doping concentration in the proximity of the region with the crystallographic imperfections.

9. The method of claim 1, wherein the method further comprises one or more of the following steps:

(i) increasing a carrier injection level through illumination;

(ii) increasing a carrier injection level through the application of an external electric field to forward bias a photovoltaic cell junction;

(iii) thermally diffusing sufficient atomic hydrogen at a temperature within the range of 100° C. to 500° C. into the region with the imperfections so that a localised atomic hydrogen concentration in one or more regions exceeds an intentional background doping concentration to cause the auto-generation of H$^0$;

(iv) maintaining (i), (ii) or (iii) or any combination of these at a temperature within the range of 100° C. to 500° C. for a minimum of 2 seconds, preferably 8 seconds and more preferably in excess of 1 minute to facilitate hydrogen passivation of the crystallographic imperfections to improve a quality of the silicon substrate.

10. The method of claim 1, wherein the method further comprises illuminating the silicon substrate with sub-bandgap photons that are able to convert H$^-$ into H$^0$.

11. The method of claim 10, wherein the method further comprises maintaining the illumination of the silicon substrate with sub-bandgap photons, at a temperature within the range of 100° C. to 500° C. for a minimum of 2 seconds, preferably 8 seconds and more preferably in excess of 1 minute to facilitate hydrogen passivation of the crystallographic imperfections to improve a quality of the silicon substrate.

* * * * *